US007804228B2

(12) United States Patent
Sadaka et al.

(10) Patent No.: US 7,804,228 B2

(45) Date of Patent: Sep. 28, 2010

(54) COMPOSITE PASSIVE MATERIALS FOR ULTRASOUND TRANSDUCERS

(75) Inventors: Alain Sadaka, San Jose, CA (US); Jian R. Yuan, Pleasanton, CA (US)

(73) Assignee: Boston Scientific Scimed, Inc., Maple Grove, MN (US)

(*) Notice: Subject to any disclaimer, the term of this patent is extended or adjusted under 35 U.S.C. 154(b) by 177 days.

(21) Appl. No.: 11/959,104

(22) Filed: Dec. 18, 2007

(65) Prior Publication Data

US 2009/0156939 A1 Jun. 18, 2009

(51) Int. Cl.
*H01L 41/04* (2006.01)

(52) U.S. Cl. ........................ 310/334; 600/457; 600/459

(58) Field of Classification Search ................. 310/334; 600/457, 459

See application file for complete search history.

(56) References Cited

U.S. PATENT DOCUMENTS

| | | | | |
|---|---|---|---|---|
| 4,514,247 | A | 4/1985 | Zola | |
| 4,523,122 | A | 6/1985 | Tone et al. | |
| 4,564,980 | A * | 1/1986 | Diepers | 29/25.35 |
| 4,572,981 | A | 2/1986 | Zola | |
| 4,869,768 | A | 9/1989 | Zola | |
| 4,876,179 | A | 10/1989 | Bast et al. | |
| 4,876,776 | A * | 10/1989 | Whatmore et al. | 29/25.35 |
| 4,963,782 | A | 10/1990 | Bui et al. | |
| 5,311,095 | A | 5/1994 | Smith et al. | |
| 5,329,496 | A | 7/1994 | Smith | |
| 5,511,296 | A * | 4/1996 | Dias et al. | 29/25.35 |
| 5,539,965 | A | 7/1996 | Safari et al. | |
| 5,548,564 | A | 8/1996 | Smith | |
| 5,615,466 | A | 4/1997 | Safari et al. | |
| 5,625,149 | A * | 4/1997 | Gururaja et al. | 73/632 |
| 5,648,942 | A * | 7/1997 | Kunkel, III | 367/176 |
| 5,744,898 | A | 4/1998 | Smith et al. | |
| 5,974,884 | A | 11/1999 | Sano et al. | |
| 6,088,894 | A * | 7/2000 | Oakley et al. | 29/25.35 |
| 6,104,126 | A * | 8/2000 | Gilmore | 310/334 |
| 6,183,578 | B1 | 2/2001 | Ritter et al. | |
| 6,225,728 | B1 | 5/2001 | Gururaja | |
| 6,225,729 | B1 * | 5/2001 | Izumi et al. | 310/334 |

(Continued)

FOREIGN PATENT DOCUMENTS

EP 0119855 A2 9/1984

(Continued)

*Primary Examiner*—J. SanMartin
(74) *Attorney, Agent, or Firm*—Frommer Lawrence & Haug LLP; Bruce E. Black

(57) ABSTRACT

Provided herein are composite passive layers for ultrasound transducers having acoustic properties that can be easily tailored to the needs of the transducer application using current microfabrication techniques. In an embodiment, a passive layer comprises metal posts embedded in a polymer matrix or other material. The acoustic properties of the passive layer depend on the metal/polymer volume fraction of the passive layer, which can be easily controlled using current microfabrication techniques, e.g., integrated circuit (IC) fabrication techniques. Further, the embedded metal posts provide electrical conduction through the passive layer allowing electrical connections to be made to an active element, e.g., piezoelectric element, of the transducer through the passive layer. Because the embedded metal posts conduct along one line of direction, they can be used to provide separate electrical connections to different active elements in a transducer array through the passive layer.

23 Claims, 7 Drawing Sheets

U.S. PATENT DOCUMENTS

| | | | | |
|---|---|---|---|---|
| 6,236,144 | B1 * | 5/2001 | Millar et al. | 310/334 |
| 6,467,138 | B1 * | 10/2002 | Aime | 29/25.35 |
| 6,467,140 | B2 | 10/2002 | Gururaja | |
| 6,625,854 | B1 * | 9/2003 | Sudol et al. | 29/25.35 |
| 6,868,594 | B2 | 3/2005 | Gururaja | |
| 7,103,960 | B2 * | 9/2006 | Aime | 29/594 |
| 2001/0050514 | A1 | 12/2001 | Gururaja | |
| 2003/0051323 | A1 | 3/2003 | Gururaja | |
| 2005/0225210 | A1 | 10/2005 | Englund et al. | |
| 2007/0038111 | A1 | 2/2007 | Rehrig et al. | |
| 2008/0042519 | A1 | 2/2008 | Marshall et al. | |
| 2010/0076318 | A1 * | 3/2010 | Rehrig et al. | 600/466 |

FOREIGN PATENT DOCUMENTS

| | | | |
|---|---|---|---|
| EP | 0137529 | A2 | 4/1985 |
| EP | 0351015 | A2 | 1/1990 |
| EP | 06767742 | A2 | 10/1995 |
| EP | 0697257 | A2 | 2/1996 |
| JP | 60135858 | A | 7/1985 |
| WO | 94/09605 | A1 | 4/1994 |
| WO | 2007017776 | A2 | 2/2007 |
| WO | 2008/021325 | A2 | 2/2008 |

* cited by examiner

COMPOSITE PASSIVE MATERIALS FOR ULTRASOUND TRANSDUCERS

FIELD OF THE INVENTION

The present invention relates to ultrasound transducers, and more particularly to composite passive materials for ultrasound transducers.

BACKGROUND INFORMATION

An ultrasound transducer is typically fabricated as a stack of multiple layers that depend on the application of the transducer. FIGS. 1*a* and 1*b* show typical ultrasound transducers. Each transducer comprises, from the bottom up, a backing layer 30, a bottom electrode layer 17, an active element layer (e.g., piezoelectric element or PZT) 10, a top electrode layer 13, a matching layer (or multiple matching layers) 20, and a lens layer (for focused transducers) 35 and 45. The lens may be a convex lens 35 or a concave lens 45. The backing, matching and lens layers are all passive materials that are used to improve and optimize the performance of the transducer. The backing layer is used to attenuate ultrasound energy propagating from the bottom of the transducer so that ultrasound emissions are directed from the top of the transducer and the matching layer is used to enhance acoustic coupling between the transducer and surrounding environment. Different transducer designs (different sizes, frequencies, applications, etc.) require passive materials with different acoustic properties. Therefore, there is a need for effective methods to control the acoustic properties of these materials to deliver consistent performance while maintaining manufacturability and compliance with processing methods.

A common method to control the properties of passive layers is to add different fillers in different quantities to an epoxy or polymer to create a matrix. Common filler materials include tungsten, alumina, and silver (e.g., in powder form). For example, silver is used in very high quantities to make an otherwise insulating epoxy conductive. Tungsten and alumina are used to control the acoustic impedance of the passive layer by varying the filler/epoxy matrix density. Although the method of using fillers has several advantages in terms of flexibility, simplicity and cost, it also has several drawbacks. This method can only raise the acoustic impedance up to a certain point after which the epoxy saturates and will not mix with any additional filler. Also, the filler can move around in the epoxy before the epoxy is cured, making it difficult to control the final distribution of the filler in the epoxy. Another drawback with tungsten and alumina is that the composite material remains nonconductive. Another drawback is that changing the composition of the passive layers in many cases also affects their manufacturability.

Some of these drawbacks can be overcome by adding more processing steps or using novel mixing, casting and fabrication techniques. However, these techniques eliminate the main advantage of using filer/epoxy matrices, which is simplicity and flexibility.

Therefore, there is a need for passive layers and fabrication methods that provide high flexibility and manufacturability without sacrificing performance or cost.

SUMMARY OF THE INVENTION

Provided herein are composite passive layers for ultrasound transducers having acoustic properties that can be easily tailored to the needs of the transducer application using current microfabrication techniques.

In an embodiment, a passive layer comprises metal posts embedded in a polymer matrix or other material. The acoustic properties of the passive layer depend on the metal/polymer volume fraction of the passive layer, which can be easily controlled using current microfabrication techniques, e.g., integrated circuit (IC) fabrication techniques. Further, the metal posts provide electrical conduction through the passive layer allowing electrical connections to be made to an active element, e.g., piezoelectric element, of the transducer through the passive layer. Because the embedded metal posts in the example embodiment conduct along one line of direction, they can be used to provide separate electrical connections to different active elements in a transducer array through the passive layer.

In an embodiment, a passive layer is fabricated by applying a photoresist, e.g., using spin coating. Spin coating allows the thickness of the photoresist to be precisely controlled by varying the viscosity of the photoresist and spin parameters. The photoresist is then exposed to UV light through a mask to transfer a pattern from the mask to the photoresist. Portions of the photoresist are then selectively removed, e.g., using a developer, based on the pattern. Metal is then deposited in the areas where the photoresist has been removed to form the metal posts of the passive layer. Because the spacing, arrangement, and dimensions of the metal posts can be precisely controlled by the mask pattern, this fabrication method allows the metal/polymer fraction volume, and hence acoustic properties of the passive layer to be easily controlled.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

In order to better appreciate the above recited and other advantages of the present inventions are objected, a more particular description of the invention briefly described above will be rendered by reference to specific embodiments thereof, which are illustrated in the accompanying drawings. It should be noted that the components in the figures are not necessarily to scale, emphasis instead being placed upon illustrating the principles of the invention. Moreover, in the figures, like reference numerals designate corresponding parts throughout the different views. However, like parts do not always have like reference numerals. Moreover, all illustrations are intended to convey concepts, where relative sizes, shapes and other detailed attributes may be illustrated schematically rather than literally or precisely.

DETAILED DESCRIPTION

Figure 1A:
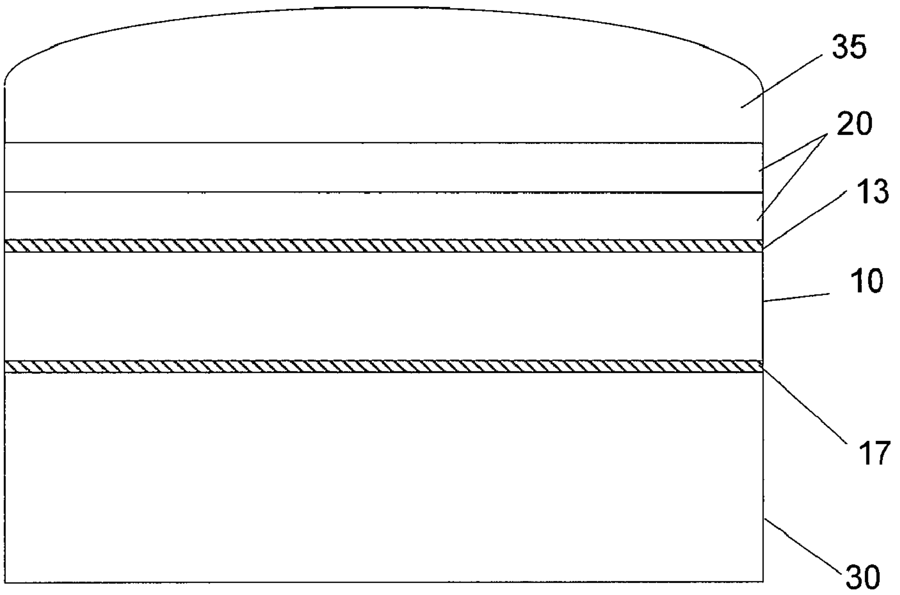
FIG. 1(a) (Prior Art)
FIG. 1*a* shows a prior art ultrasound transducer comprising of a stack of layers with a convex lens.
Figure 1B:
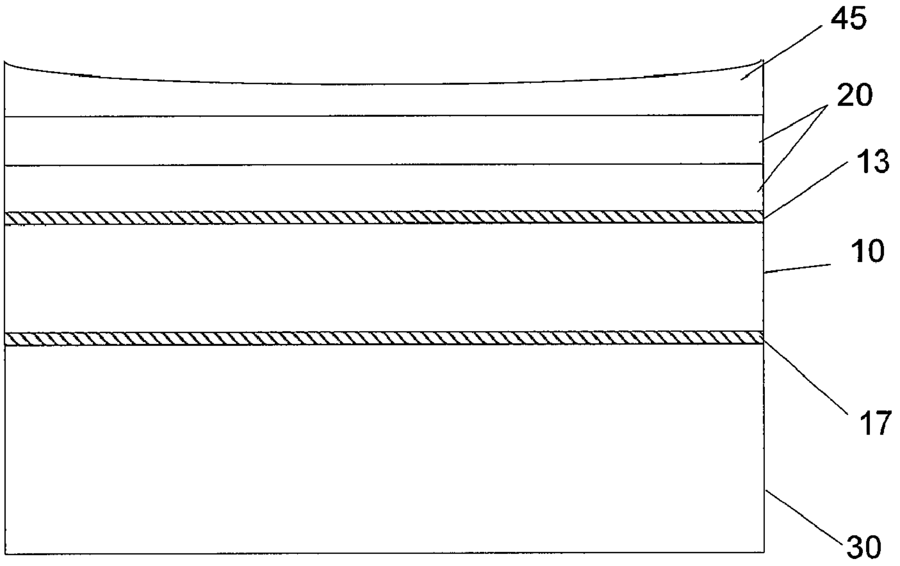
FIG. 1(b) (Prior Art)
FIG. 1*b* shows a prior art ultrasound transducer comprising of a stack of layers with a convex lens.
Figure 2:
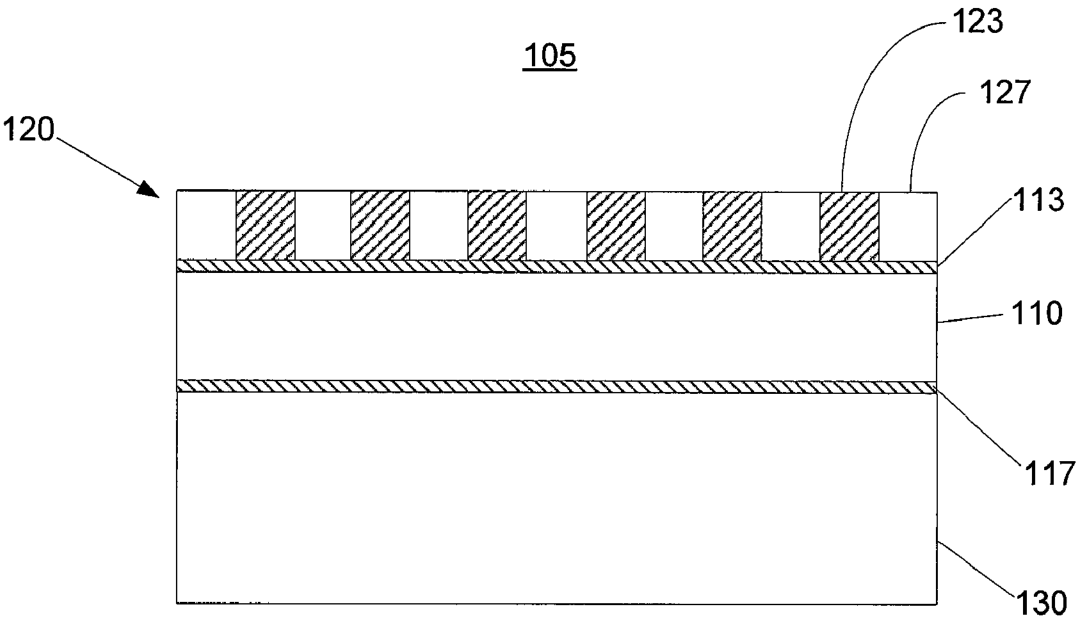
FIG. 2 shows a transducer according to an exemplary embodiment of the present invention.

FIG. 2 shows an exemplary ultrasound transducer 105 according to an embodiment of the invention. The transducer 105 comprises an active element 110, e.g., a piezoelectric element, and top and bottom electrodes 113 and 117 deposited on the top and bottom surfaces of the active element 110, respectively. The electrodes 113 and 117 may comprise thin layers of gold, chrome, or other conductive material. The transducer's emitting face may have a square shape, circular shape, or other shape.

The transducer 105 further comprises a matching layer 120 on top of the active element 110. The matching layer 120 comprises a plurality of metallic posts 123 embedded in a polymer matrix 127 or other material. The acoustic properties of the matching layer 120 depend on the metal/polymer volume fraction of the matching layer 120. Generally, the acoustic impedance increases for increases in the volume fraction of metal. For other materials, the acoustic properties depend on the metal/material volume fraction, where the material is the material in which the metal posts are embedded. As discussed below, the metal/polymer volume fraction can be easily controlled using current microfabrication techniques, e.g., IC and MEMS fabrication techniques. Because the metal/polymer volume fraction can be easily controlled, the acoustic properties of the matching layer 120 can be easily tailored to the needs of the transducer application using current fabrication techniques. The transducer 105 also comprises a backing layer 130 underneath the active element 110.

Figure 3:
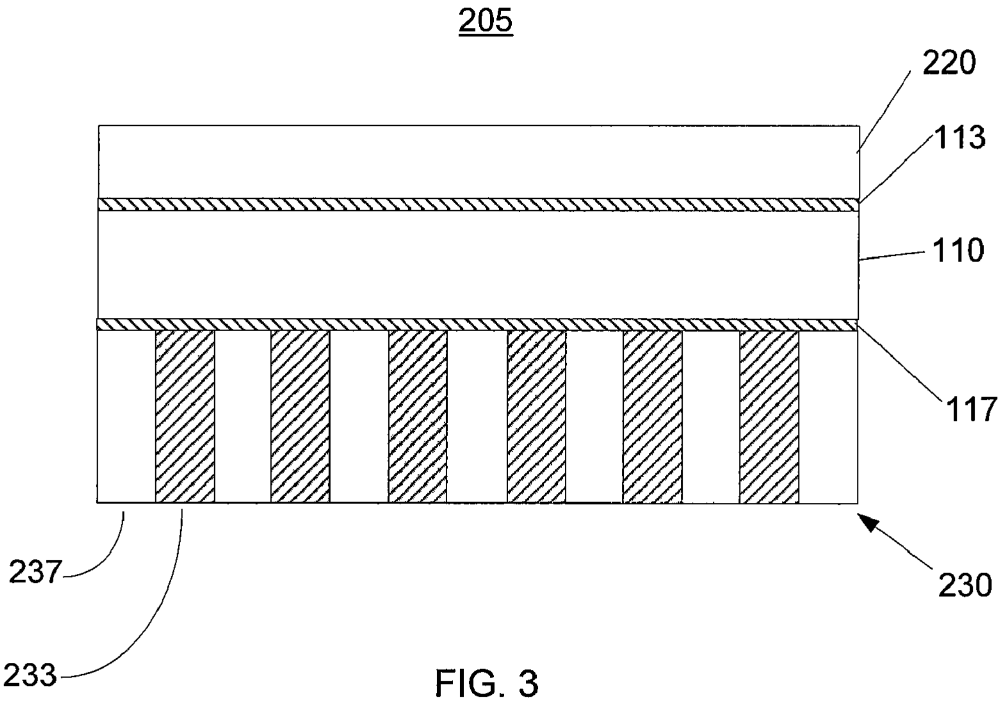
FIG. 3 shows a transducer according to another exemplary embodiment of the present invention.

FIG. 3 shows an exemplary ultrasound transducer 205 according to another embodiment of the invention. Similar to the previous embodiment, the transducer 205 comprises an active element 110, e.g., piezoelectric element, and top and bottom electrodes 113 and 117 deposited on the top and bottom of the active element 110, respectively. The transducer 205 also comprises a matching layer 220 on top of the active element 110.

The transducer 205 further comprises a backing layer 230 underneath the active element. The backing layer 230 comprises a plurality of metallic posts 233 embedded in a polymer matrix 237 or other material. The acoustic properties of the backing layer 230 depend on the metal/polymer volume fraction of the backing layer 230, which can be easily controlled using current microfabrication techniques, e.g., IC and MEMS fabrication techniques.

Figure 4:
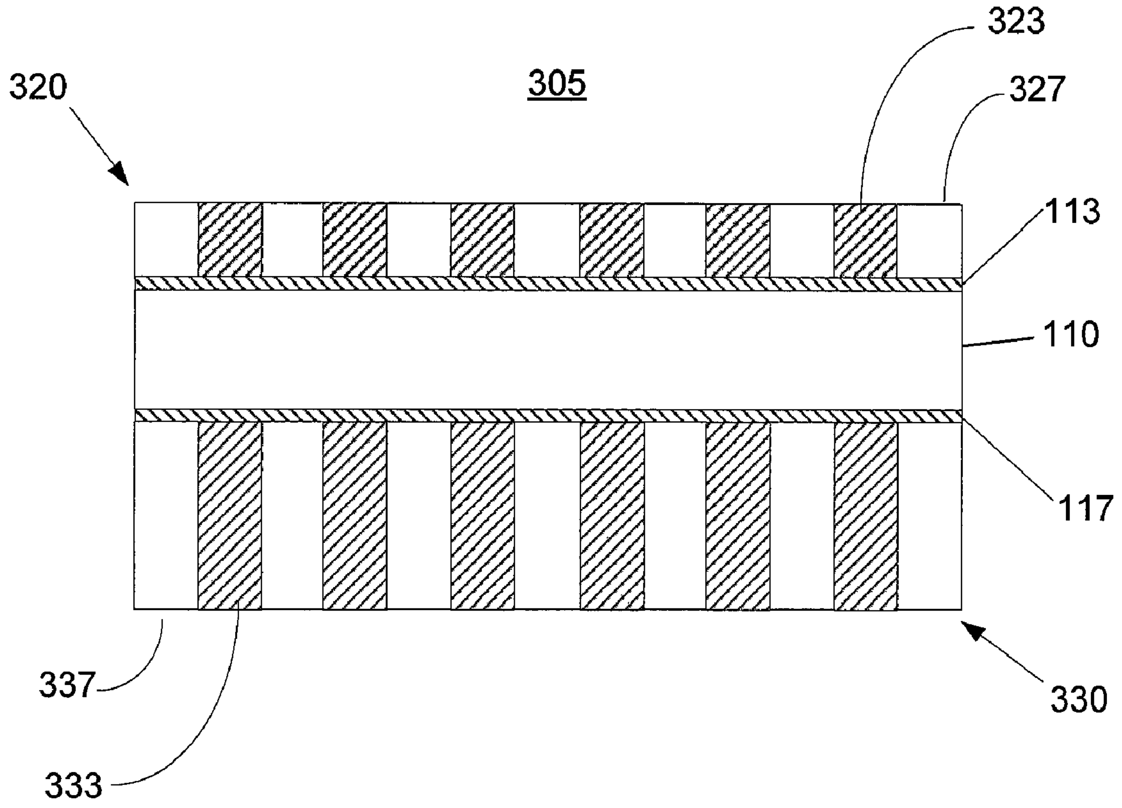
FIG. 4 shows a transducer according to yet another exemplary embodiment of the present invention.
Figure 5A:
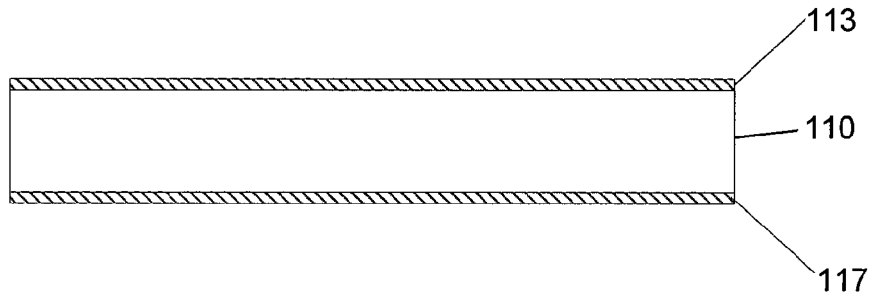
FIGS. 5*a*-5*e* show process steps for fabricating a transducer according to an exemplary embodiment of the present invention.
Figure 5B:
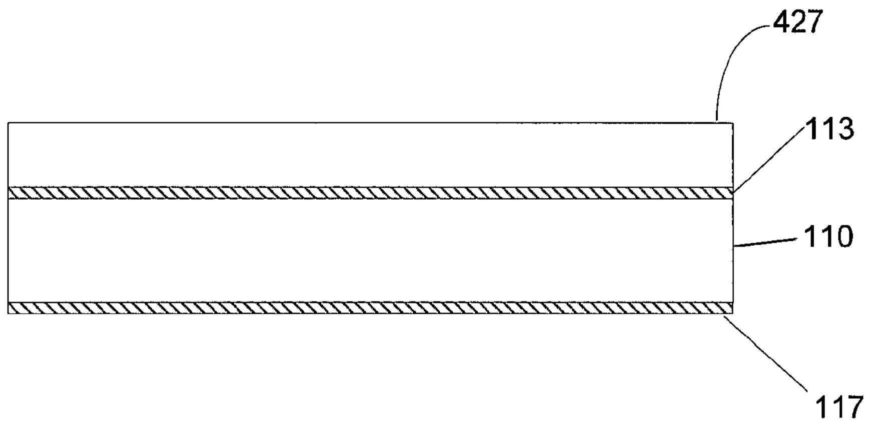
Figure 5C:
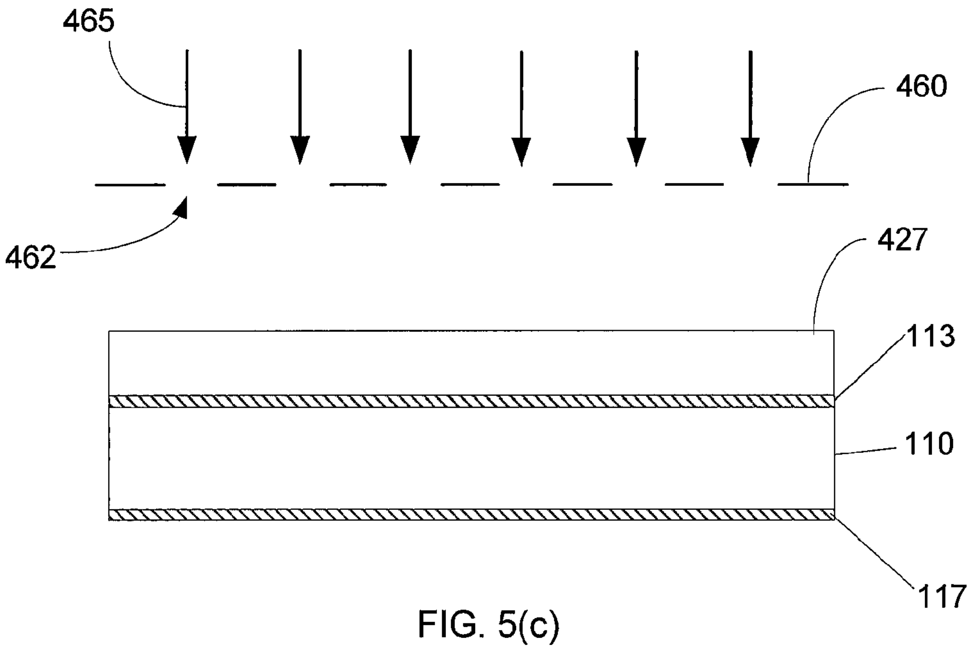
Figure 5D:
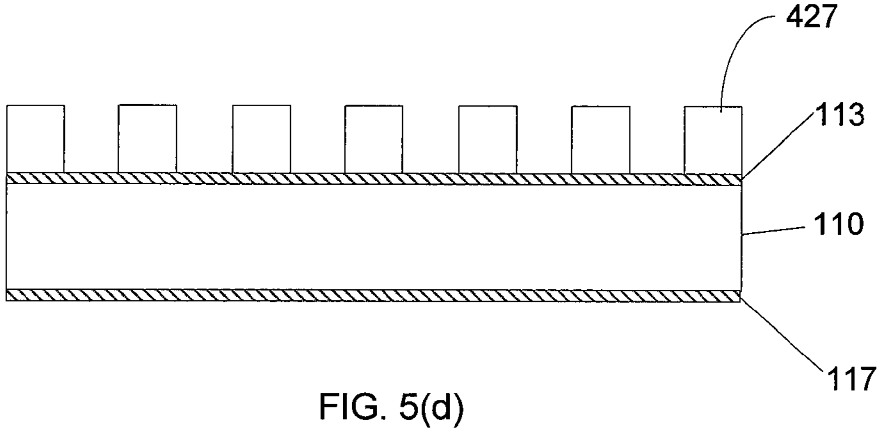
Figure 5E:
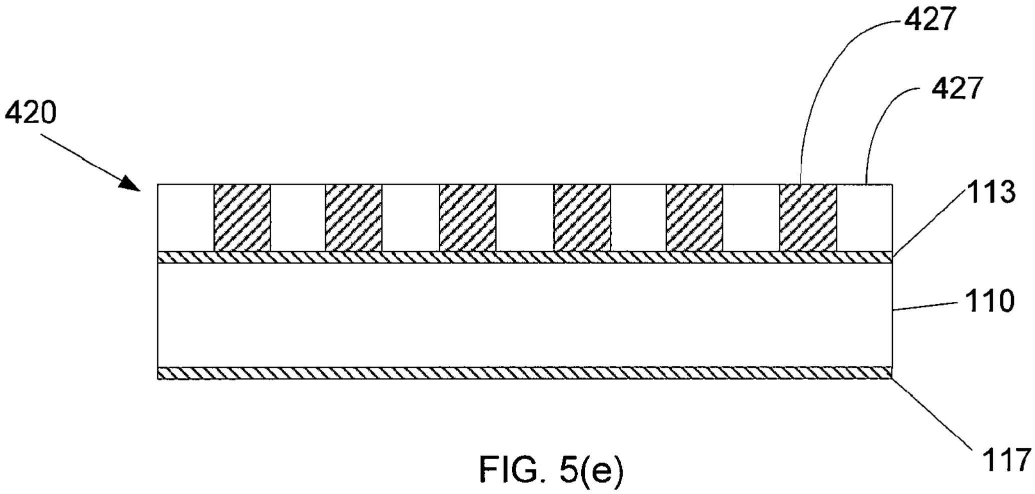

FIG. 4 shows an exemplary ultrasound transducer according to yet another embodiment of the invention. In this embodiment, the matching layer 320 comprises a plurality of metallic posts 323 embedded in a polymer matrix 327 or other material. Similarly, the backing layer 330 comprises a plurality of metallic posts 333 embedded in a polymer matrix 337 or other material.

Processing steps for fabricating a transducer according to an exemplary embodiment will now be given with reference to FIGS. 5(*a*)-5(*e*). In this example, a matching layer is fabricated on the active element. However, it is to be understood that the processing steps can also be used to fabricate the backing layer or other passive layers of the transducer.

FIG. 5(*a*) shows an active element 110, e.g., a piezoelectric element, with top and bottom electrodes 113 and 117, e.g., gold on chrome electrodes.

In FIG. 5(*b*) a layer of light-sensitive polymer or epoxy 427 is applied on top of the active element 110 using spin or spray coating. Other coating processes may also be used. In this example, spin coating is used to apply the layer of light-sensitive polymer or epoxy 427. The polymer or epoxy may be mixed with precursors and solvents to obtain a desired thickness. By varying the polymer or epoxy viscosity and the spin parameters, the coat thickness can be precisely controlled. Most light-sensitive epoxies and polymers are known as photoresists (e.g., UV cured epoxies) and they are classified as either positive or negative based on their response to light. Positive photoresist becomes weaker and more soluble when exposed to light while negative photoresist becomes stronger and less soluble when exposed to light. Photoresists are commonly used in IC and MEMS fabrication with consistent repeatable results.

In FIG. 5(*c*), a mask 460, e.g., chrome on glass, is used in conjunction with light exposure equipment to form a pattern in the photoresist 427. In this example, the photoresist 427 is positive and the mask 460 is transparent 462 in areas where the photoresist 427 is to be removed. UV light 465 is filtered through the mask 460 and reaches the underlying photoresist 427. The areas of the photoresist 427 corresponding to the transparent areas 462 of the mask 460 are exposed to the UV light 465. For the example of negative photoresist, the mask would be opaque in areas where the photoresist is to be removed.

In FIG. 5(*d*), the areas of the photoresist 427 that were exposed to light are removed with a developer, e.g., solvent, leaving the desired pattern imprinted in the photoresist 427. In FIG. 5(*e*), the metal posts 423 are deposited on top of the active element 110 in the areas where the photoresist 427 has been removed. The metal posts 423 may be deposited using sputtering, electroplating, or other metal deposition method. The metal may be nickel, silver, or other conductive material. The photoresist 427 and embedded metal posts 423 form the matching layer 420.

The acoustic properties of the matching layer 420 depend on the metal/polymer volume fraction of the matching layer 420. Because the spacing, arrangement and dimensions of the metal posts 423 can be tightly controlled using the above process steps, the metal/polymer fraction can be tightly controlled to obtain the desired acoustic properties of the matching layer 420 and optimize the transducer design. The pattern (opaque and transparent areas) of the mask determines the spacing, arrangement and dimensions of the metal posts, and hence the metal/polymer volume fraction. The above process can also be used to fabricate the backing layer to control the acoustic properties of the backing layer, and other passive layers to control their acoustic properties.

Therefore, the above process provides an effective method to customize the acoustic properties of passive layers for a particular transducer application. Further, the above process is compatible with current fabrication methods, e.g. IC and MEMS fabrication methods.

Instead of the passive layer comprising the photoresist, the photoresist may be removed, e.g., stripped off, after the metal posts are deposited. A polymer or epoxy may then be applied around the metal post to form the passive layer. For the example of epoxy, the epoxy may be applied around the metal posts, then cured and ground down to the desired passive layer thickness.

Other materials may be used to form the posts besides metal, including nonconductive materials such as oxide, nitride, and the like. In this example, the acoustic properties of the passive layer depends on the volume fraction of the post material to the polymer, e.g., photoresist, in the passive layer.

Metal posts embedded in a polymer matrix not only control the acoustic properties of the passive layer, but also make the passive layer conductive along one direction. A conductive passive layer is advantageous in an ultrasound transducer because it simplifies the electrical connections of the positive and/or negative leads to the active element.

Figure 6:
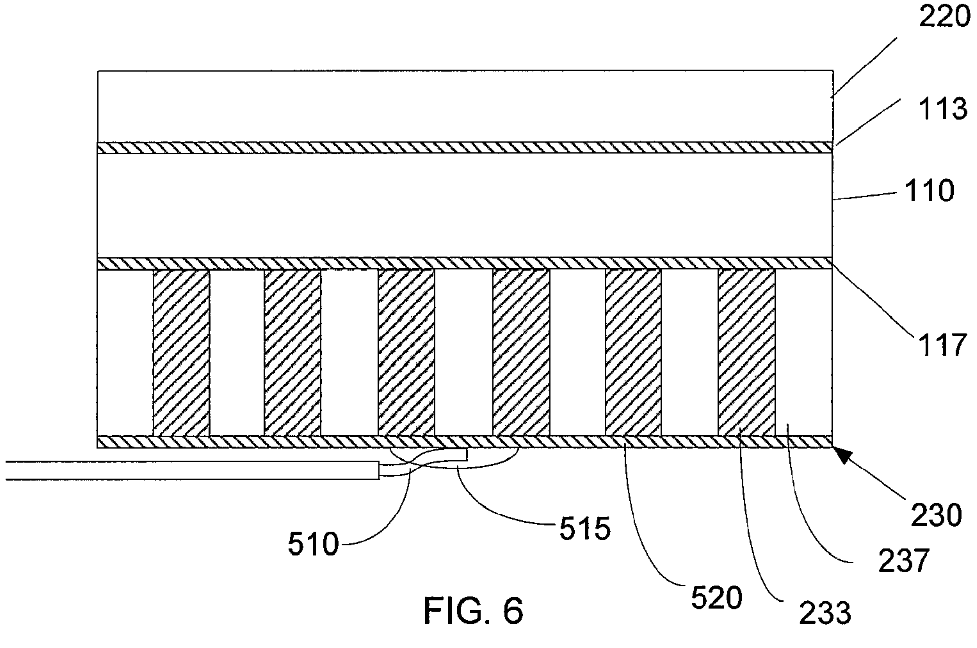
FIG. 6 shows a lead connected to a transducer according to an exemplary embodiment of the present invention.

FIG. 6 shows an example of a lead 510 electrically connected to the bottom of the active element 110 through the backing layer 230, which comprises metal posts 233 embedded in a polymer matrix 237. In this example, the lead 510 may be connected to the backing layer 230, e.g., by a conductive epoxy or solder 515, or laser fused to the backing layer. A thin electrode layer 520 may be deposited on the bottom of the backing layer 230 to facilitate the electrical connection. The lead 510 may be part of a twisted pair wire or connected at the other end to a coaxial cable. A lead (not shown) may similarly be electrically connected to the active element through the matching layer. Alternatively, a portion of the matching layer may be removed to expose a small area of the top electrode 113, and the lead (not shown) connected directly to the top electrode 113.

Because the metal posts embedded in the polymer matrix are conductive along one direction (thickness direction), the metal post can be used to provide separate electrical connections to different active elements in a transducer array. This is advantageous over silver based conductive epoxy, which cannot provide separate electrical connections.

Figure 7:
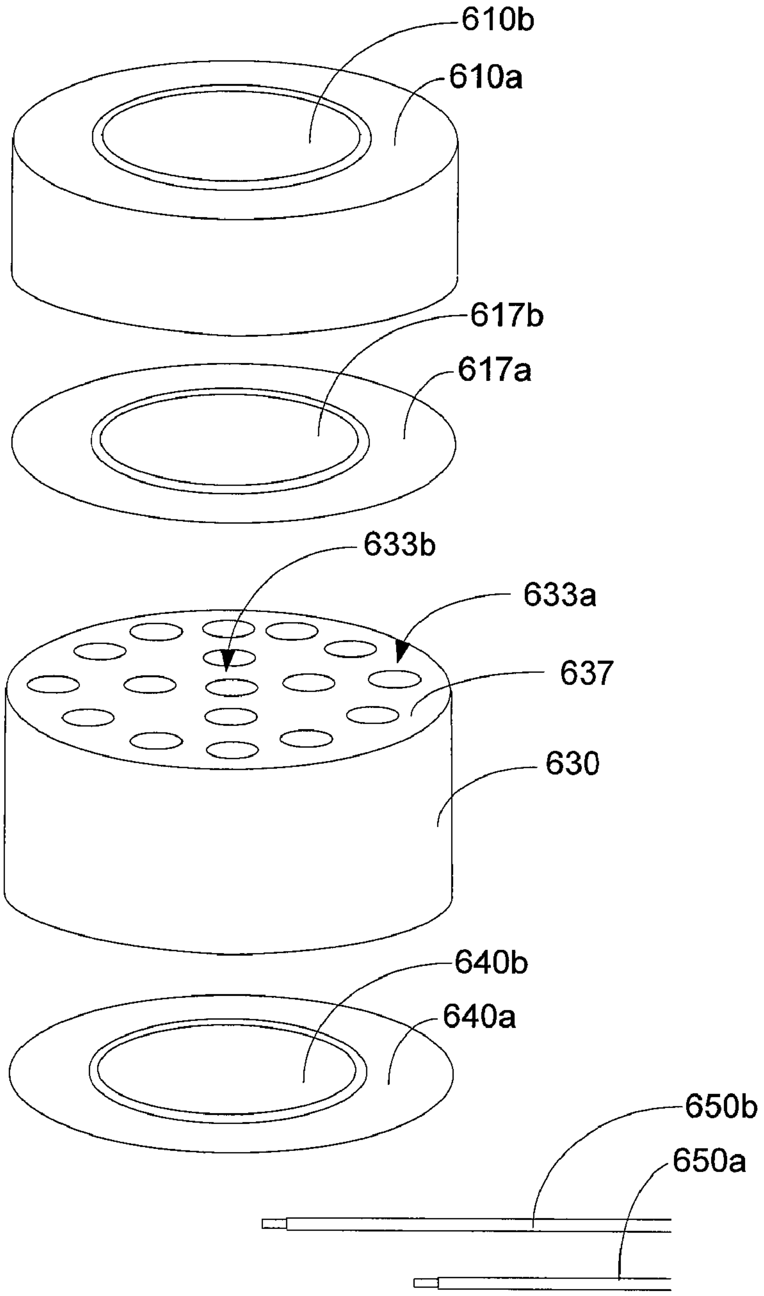
FIG. 7 shows an exploded view of a transducer array according to an exemplary embodiment of the present invention.

The ability of the metal posts to provide separate electrical connection in a transducer array is illustrated in FIG. 7. FIG. 7 shows an exploded view of an exemplary transducer array comprising two concentric active elements 610*a* and 610*b*, e.g., piezoelectric elements PZTs. The transducer array may have more than two active elements.

The transducer array further comprises two electrodes 617*a* and 617*b* on the bottom of the active elements 610*a* and 610*b*, respectively. The electrodes 617*a* and 617*b* are electrically isolated from each other and may comprise thin layers of gold, chrome, or other metal deposited on the active elements. The transducer array further comprises a backing layer 630 comprising metal posts 633*a* and 633*b* embedded in a polymer matrix 637. The metal posts 633*b* are aligned with the electrode 617*b* while the other metal posts 633*a* are aligned with the electrode 617*a*. The number and arrangement of the metal posts shown in FIG. 7 are exemplary only. The backing layer 630 may comprise any number of posts in different arrangements. Further, the posts may have different shapes than the ones shown in FIG. 7.

The transducer array also comprises electrodes 640*a* and 640*b* on the bottom of the backing layer 630. The electrodes 640*a* and 640*b* may be connected to separate leads 650*a* and 650*b*, respectively, by conductive epoxy, solder, or the like. The electrode 640*b* aligns with metal posts 633*b* and electrode 617*b* while the electrode 640*a* aligns with metal posts 633*a* and electrode 617*a*. Thus, the electrode 640*b* provides an electrical connection to active element 610*b* through metal posts 633*b* and electrode 617*b* while the electrode 640*a* provides an electrical connection to active element 610*a* through metal posts 633*a* and electrode 617*a*. Therefore, the embedded metal posts 633*a* and 633*b* enable separate electrical connections to different active elements 610*a* and 610*b* in the transducer array through the passive layer 630. The same principle may be applied to the matching layer (not shown in FIG. 7) to provide separate electrical connections through the matching layer. The separate electrical connections provided by the metal post allow the active elements in a transducer array to be independently controlled and driven.

A passive layer comprising embedded metal posts can be used in other transducer arrays having different configurations and sizes depending on the application of the array. Examples of transducer arrays include linear and annular transducer arrays, two-dimensional transducer arrays, and the like.

Figure 8:
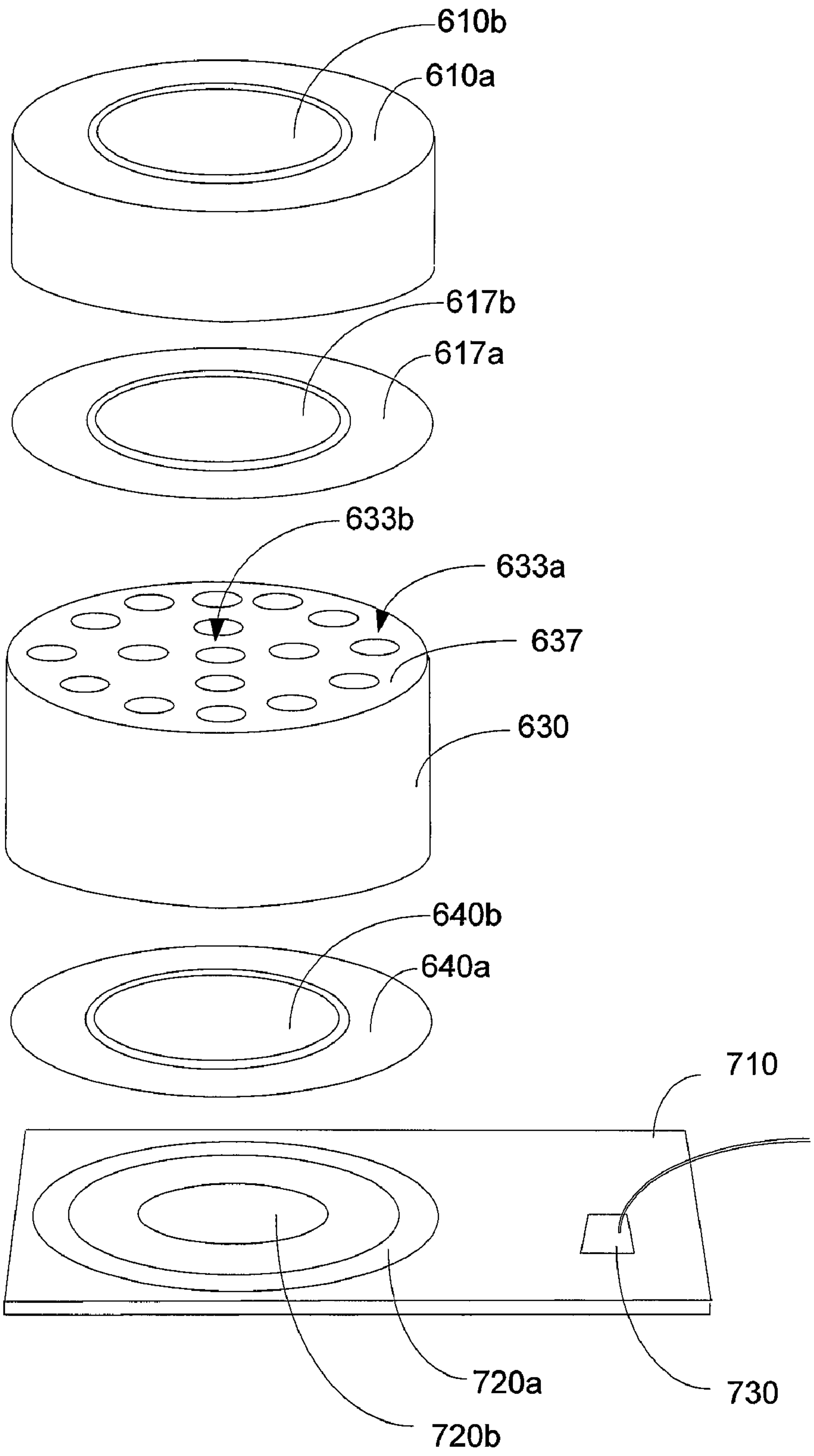
FIG. 8 shows an exploded view of a transducer array according to another exemplary embodiment of the present invention.

The advantages that transducers arrays provide in performance and beam manipulation generally come at the price of more complex electronics and controls for coordinating and driving the separate elements of the arrays. FIG. 8 shows an exploded view of an exemplary transducer array, in which electronics for controlling the elements of the array are provided near the transducer array. The transducer array in FIG. 8 is similar to the one in FIG. 7 except for an integrated circuit (IC) chip 710 connected to the bottom electrodes 640*a* and 640*b* of the backing layer 630. The IC chip 710 comprises metal contact pads 720*a* and 720*b* that align with electrodes 640*a* and 640*b*, respectively. The electrodes 640*a* and 640*b* may be bonded to the metal contact pads 720*a* and 720*b*, respectively, e.g., using solder bumps, to electrically connect the IC chip 710 to the transducer array. The IC chip 710 also comprises a metal contact pad 730 to connect the IC chip 710 to an ultrasound system via a cable, twisted pair wires, or the like. The electronics of the IC chip 710 may be fabricated on a silicon substrate using standard CMOS microfabrication techniques.

In this embodiment, the IC chip 710 may contain electronics for individually controlling and driving the active elements 610*a* and 610*b* of the array. For example, the electronics of the IC chip 710 may comprise multiplexers and switches for selectively coupling a signal to one of the active elements. This advantageously reduces the number of signals that need to be transmitted over a cable to and from a remote ultrasound system. The unidirectional conduction of the metal posts 633*b* and 633*a* allow the IC chip to individually address the active elements 610*b* and 610*a*, respectively.

Instead of bonding the IC chip to the transducer array, the IC chip may be located near the transducer array and connected to the transducer array, e.g., by wires. For example, the IC chip and transducer array may be mounted in the same housing next to each other. The IC chip may also be electrically connected to the transducer array through metal posts embedded in the matching layer as an alternative or in addition to the backing layer. Further, the electronics of the IC chip may include filters and processors for filtering and processing signals from the transducer array before sending the signals over a cable to the remote ultrasound system.

Although metal posts were used in the preferred embodiment to provide conduction through the passive layer, other conductive materials may be used for the posts.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions described herein is merely illustrative, and the invention can be performed using different or additional process actions, or a different combination or ordering of process actions. As a further example, each feature of one embodiment can be mixed and matched with other features shown in other embodiments. Additionally and obviously, features may be added or subtracted as desired. Accordingly, the invention is not to be restricted except in light of the attached claims and their equivalents.

What is claimed is:

1. An ultrasound transducer comprising:

an active acoustic element; and a passive layer attached to the active acoustic element, the passive layer comprising:

a layer of photoresist material; and a plurality of conductive posts embedded within the layer of photoresist material.

2. The transducer of claim 1, wherein the active acoustic element comprises a piezoelectric element.

3. The transducer of claim 1, wherein the plurality of conductive posts are orientated substantially perpendicular to an acoustic emitting face of the active acoustic element.

4. The transducer of claim 1, wherein the conductive posts comprise metal posts.

5. The transducer of claim 1, wherein at least one of the conductive posts extends across a thickness of the passive layer.

6. The transducer of claim 1, wherein the passive layer forms a matching layer that acoustically couples ultrasound energy from the active acoustic element.

7. The transducer of claim 1, further comprising an electrode deposited on a surface of the passive layer, wherein the electrode is electrically coupled to the active acoustic element through at least one of the conductive posts.

8. The transducer of claim 1, wherein the passive layer forms a backing layer that attenuates ultrasound energy propagation below the active acoustic element.

9. The transducer of claim 1, wherein the conductive posts are made of silver or nickel.

10. An ultrasound transducer array comprising:

a plurality of active acoustic elements; and a passive layer attached to the plurality of active acoustic elements, the passive layer comprising:

a layer of photoresist material; and a plurality of conductive posts embedded within the layer of photoresist material.

11. The transducer array of claim 10, wherein the active acoustic element comprises a piezoelectric element.

12. The transducer array of claim 10, wherein the plurality of conductive posts are orientated substantially perpendicular to an acoustic emitting face of the active acoustic element.

13. The transducer array of claim 10, wherein the conductive posts comprise metal posts.

14. The transducer array of claim 10, wherein at least one of the conductive posts extends across a thickness of the passive layer.

15. The transducer array of claim 10, wherein the passive layer forms a backing layer that attenuates ultrasound energy propagation below the active acoustic elements.

16. The transducer array of claim 10, further comprising a plurality of electrodes deposited on a surface of the passive layer, wherein each of the electrodes is electrically coupled to one of the active acoustic elements through at least one of the conductive posts.

17. The transducer array of claim 16, wherein each of the electrodes is electrically coupled to a different one of the active acoustic elements.

18. The transducer array of claim 16, further comprising an integrated circuit (IC) chip electrically coupled to the plurality of active acoustic elements through at least one of the conductors and through the plurality of electrodes deposited on the surface of the passive layer, wherein the IC chip comprises at least one metal contact pad that is directly coupled to the plurality of electrodes deposited on the surface of the passive layer.

19. The transducer array of claim 10, further comprising an integrated circuit (IC) chip electrically coupled to at least one of the active acoustic elements through at least one of the conductive posts.

20. The transducer array of claim 19, wherein the IC chip is bonded to the passive layer, with the passive layer and plurality of acoustic elements disposed on the IC chip.

21. The transducer array of claim 19, wherein the IC chip comprises a plurality of electrical contacts, and each one of the electrical contacts is electrically coupled to a different one of the active acoustic elements in the transducer array through at least one of the conductive posts.

22. The transducer array of claim 10, wherein the passive layer forms a matching layer that acoustically couples ultrasound energy from the active acoustic elements.

23. The transducer array of claim 10, wherein the passive layer is a backing layer and the transducer array further comprises:

a first array of electrodes disposed between the passive layer and the plurality of acoustic elements, wherein the first array of electrodes are electrically coupled to the conductive posts of the passive layer; and a second array of electrodes disposed on an opposite surface of the passive layer from the first array of electrodes, wherein the second array of electrodes are electrically coupled to the first array of electrodes through the conductive posts of the passive layer.

* * * * *